(12) United States Patent
Hennig et al.

(10) Patent No.: US 7,906,968 B2
(45) Date of Patent: Mar. 15, 2011

(54) NMR TOMOGRAPHY METHOD BASED ON NBSEM WITH 2D SPATIAL ENCODING BY TWO MUTUALLY ROTATED MULTIPOLE GRADIENT FIELDS

(75) Inventors: Juergen Hennig, Freiburg (DE); Maxim Zaitsev, Freiburg (DE); Anna Welz, Gundelfingen (DE); Gerrit Schultz, Freiburg (DE)

(73) Assignee: Universitaetsklinikum Freiburg, Freiburg (DE)

( * ) Notice: Subject to any disclaimer, the term of this patent is extended or adjusted under 35 U.S.C. 154(b) by 220 days.

(21) Appl. No.: 12/291,680

(22) Filed: Nov. 12, 2008

(65) Prior Publication Data
US 2009/0128148 A1  May 21, 2009

(30) Foreign Application Priority Data
Nov. 16, 2007  (DE) .......................... 10 2007 054 744

(51) Int. Cl.
  *G01V 3/00* (2006.01)
(52) U.S. Cl. ...................................... 324/318; 324/319
(58) Field of Classification Search .................. 324/318, 324/319, 322
See application file for complete search history.

(56) References Cited

U.S. PATENT DOCUMENTS

| | | | |
|---|---|---|---|
| 5,530,354 A * | 6/1996 | Herlihy et al. ................ | 324/318 |
| 6,657,432 B1 * | 12/2003 | Morrone ....................... | 324/309 |
| 6,680,610 B1 | 1/2004 | Kyriakos et al. | |
| 6,842,003 B2 | 1/2005 | Heid et al. | |
| 7,135,864 B1 * | 11/2006 | McKinnon et al. .......... | 324/318 |
| 7,411,395 B2 | 8/2008 | Hennig | |
| 2003/0201775 A1 | 10/2003 | Boskamp | |

FOREIGN PATENT DOCUMENTS

JP    08280652 A    4/1995

OTHER PUBLICATIONS

Cho, ZH., Yi, JH. (1991) "A Novel Type of Surface Gradient Coil", J. Magn. Reson. 94: 471-495.
Nieman BJ, Bishop J. Dazai J, Bock NA, Lerch JO, Feintuch A. Chen XJ, Sled JG, Henkelman RM, "MR Techonology for Biological Studies in Mice", NMR Biomed. May 2007; 20(3): 291-303.

\* cited by examiner

*Primary Examiner* — Louis M Arana
(74) *Attorney, Agent, or Firm* — Walter A. Hackler

(57) ABSTRACT

A nuclear magnetic resonance (NMR) imaging method in which, with the aid of a gradient system, a spatially and temporally variable magnetic field $B_{grad}$ is generated, for the at least two-dimensional spatial encoding of NMR measurement signals in a measurement sample region to be imaged, where the magnetic field $B_{grad}$ is employed in at least two forms $B_{grad}^1$ and $B_{grad}^2$ in the measurement sample region to be imaged during a single measurement cycle from excitation to reading of the NMR measurement signals, where the first form $B_{grad}^1$ has essentially ns poles, where ns is an even number > 2, and has ns essentially sectorial sub-regions, in each of which the magnetic field $B_{grad}$ is locally monotonic in one direction, where the measurement signals from the measurement sample are recorded by means of at least ns receiver coils which have different sensitivity over the ns sub-regions of the region to be imaged, is characterized in that the second form $B_{grad}^2$ is essentially identical to the first form $B_{grad}^1$ % with the second form $B_{grad}^2$ being rotated by an angle $\Delta\phi$, where $$\Delta\varphi = \frac{360°}{2 \cdot ns},$$

relative to the first form $B_{grad}^1$.
The invention provides an NMR imaging method in which a high-resolution image of the region to be imaged is obtained more quickly utilizing the advantages of NBSEMs.

12 Claims, 6 Drawing Sheets

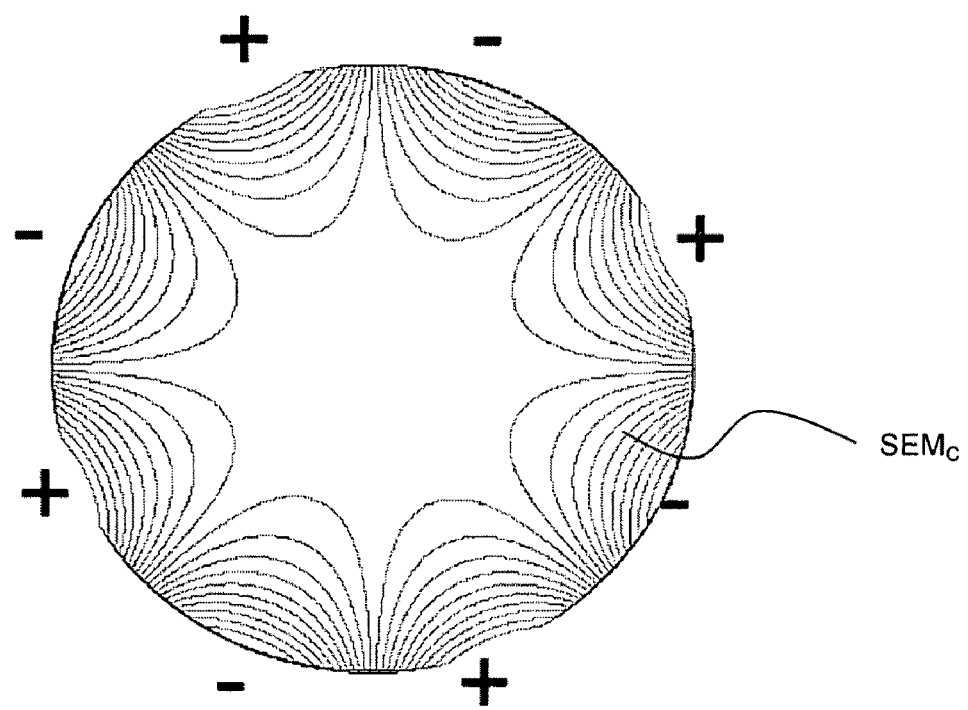
Fig. 2a
Fig. 2b
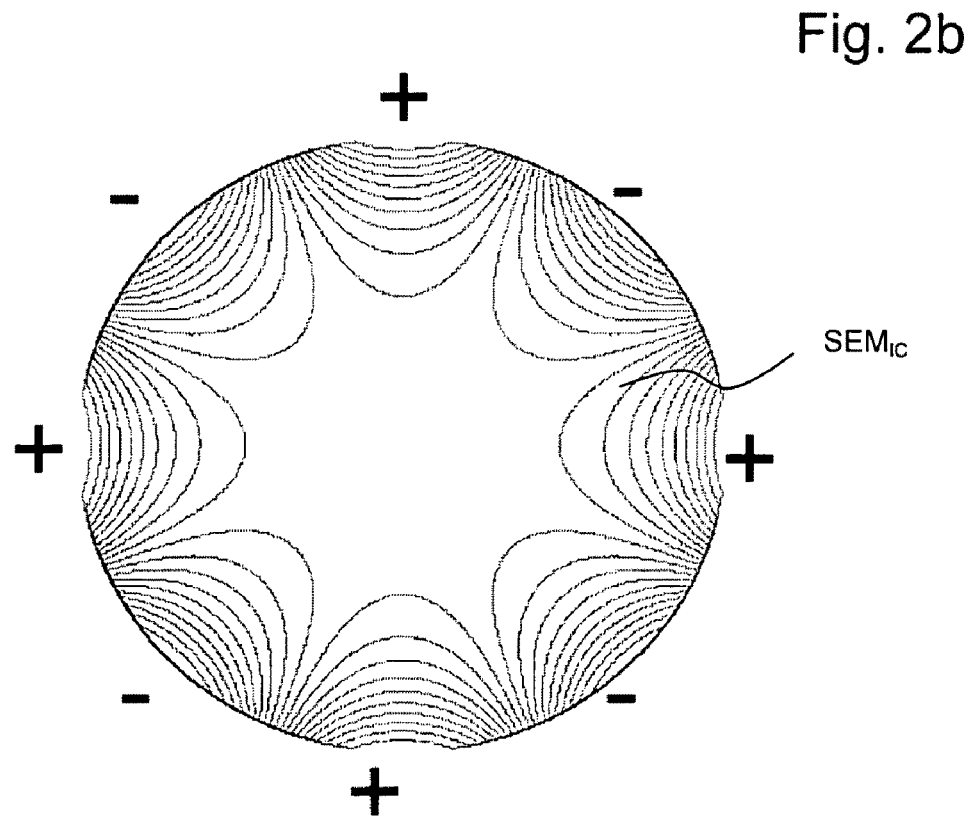

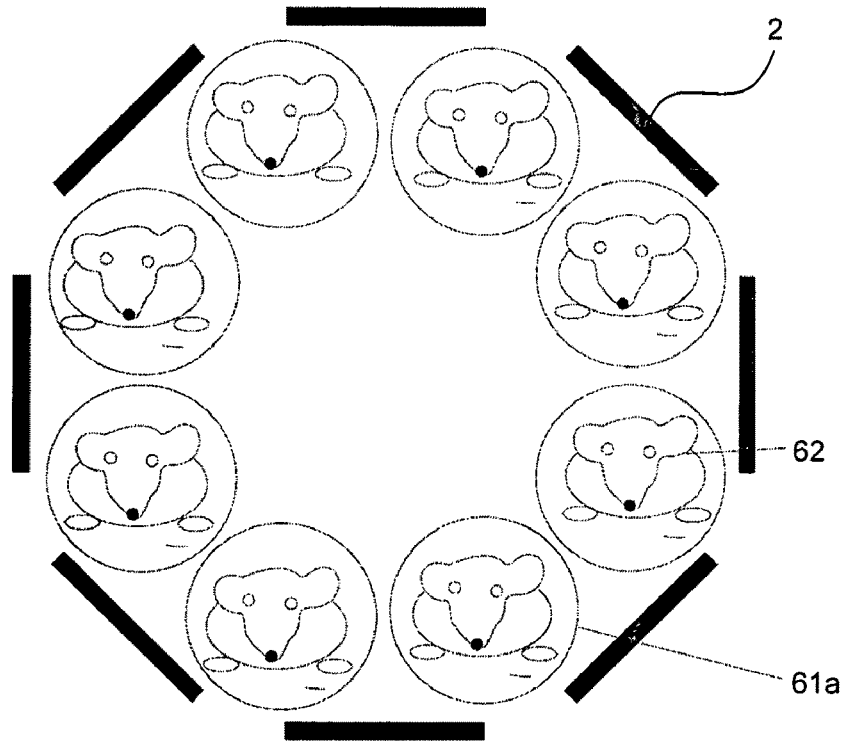
Fig. 6a
Fig. 6b
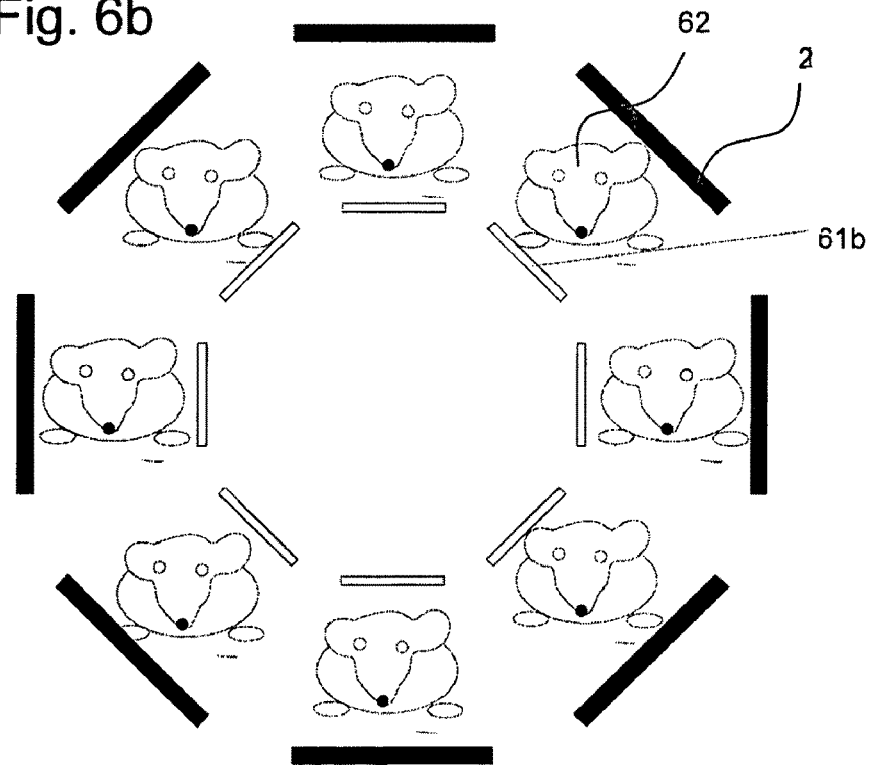

NMR TOMOGRAPHY METHOD BASED ON NBSEM WITH 2D SPATIAL ENCODING BY TWO MUTUALLY ROTATED MULTIPOLE GRADIENT FIELDS

The invention relates to a nuclear magnetic resonance (NMR) imaging method in which, with the aid of a gradient system, a spatially and temporally variable magnetic field $B_{grad}$ is generated, for the at least two-dimensional spatial encoding of NMR measurement signals in a measurement sample region to be imaged, where the magnetic field $B_{grad}$ is employed in at least two forms $B_{grad}^1$ and $B_{grad}^2$ in the measurement sample region to be imaged during a single measurement cycle from excitation to reading of the NMR measurement signals, where the first form $B_{grad}^1$ has essentially ns poles, where ns is an even number $\geq 2$, and has ns essentially sectorial sub-regions, in each of which the magnetic field $B_{grad}$ is locally monotonic in one direction, where the measurement signals from the measurement sample are recorded by means of at least ns receiver coils which have different sensitivity over the ns sub-regions of the region to be imaged.

A method of this type was disclosed in DE 10 2005 051 021 A1.

Nuclear magnetic resonance (=NMR) tomography, also known as magnetic resonance imaging, is a powerful method for the analysis of the internal structure of extended samples. NMR imaging is used, in particular, in medicine for taking a three-dimensional look at the inside of the human body. NMR imaging advantageously does not use ionizing radiation (like X rays) and is non-invasive.

In NMR methods, a sample is subjected to a strong static magnetic field, and high-frequency (=HF) pulses are introduced into the sample. The HF reaction of the sample is measured and evaluated. In order to obtain spatially resolved information during NMR tomography, the NMR measurement must be carried out with so-called spatial encoding. For the spatial encoding, spatially and optionally also temporally variable magnetic fields (also known as "gradient fields") are employed. The encoding magnetic fields are intermittently superimposed on the strong static magnetic field $B_0$, and the gradient dB/dz caused by the spatial change in the gradient fields causes spatial encoding, with the z direction corresponding to the direction of the static field. In the simplest case, a magnetic field which is monotonically (and typically also linearly) variable over the sample region to be imaged with the location is employed for the encoding. An unambiguous assignment of the Larmor frequency to the location within the region to be imaged then arises.

The resolution of NMR imaging is highly dependent on the steepness of the gradients of the encoding magnetic fields. The steeper the gradient, the better the spatial resolution of the tomographic measurement.

If a steep gradient is employed over a relatively large sample region to be imaged, considerable absolute magnetic-field differences arise over the sample. If the gradient is then switched rapidly, as is usual in more recent NMR imaging methods, Lorentz forces result in the occurrence of strong mechanical loads (in particular vibrations) in the tomograph, which are associated with considerable noise nuisance (100 dB or more). In addition, neurological stimulation may occur in patients being subjected to NMR tomography.

In order to avoid large magnetic-field differences in the region to be imaged, it has been proposed to divide the region to be imaged into sub-regions in each of which a monotonic encoding magnetic field prevails locally, but the absolute magnetic-field values recur in the various sub-regions, cf., for example, DE 2005 051 021 A1. Within the sub-regions, the encoding magnetic field can then in each case have a steep gradient, and the absolute magnetic-field difference over the entire region to be imaged is only approximately as large as the absolute magnetic-field difference in one of the sub-regions. An encoding magnetic field of this type is also known as an ambivalent/non-bijective spatially encoding magnetic field (NBSEM). However, the assignment between magnetic-field strength and location over the region to be imaged is no longer unambiguous with an NBSEM. In order nevertheless to achieve a clear spatial assignment in the region to be imaged, measurement coils having different sensitivity in the sub-regions are employed.

In medical NMR, the NMR signal from a sample is usually measured and displayed in a sequence of successive two-dimensionally resolved layers. For two-dimensionally spatially resolved measurement of a single layer, it is known to employ correspondingly two different forms of encoding magnetic field during a single measurement cycle from excitation to reading of the NMR measurement signals.

DE 10 2005 051 021 A1, in particular FIGS. 11a, 11b, with the associated description, proposes a radial field gradient and a multipole field arrangement, each as NBSEMs, as the two forms of the encoding magnetic field in a single measurement cycle.

However, this prior art has the disadvantage that spoke-shaped regions with poor spatial encoding form in a two-dimensional tomogram measured with these two forms of the encoding magnetic field. As a measure for obtaining complete spatial encoding, DE 10 2005 051 021 A1 recommends making two successive tomograms of the identical region to be imaged, with the multipole field arrangement being rotated through half a pole separation angle between the first and second tomograms. A radial field gradient in each case serves as the other form in each of the two tomograms. Since the low-resolution spoke-shaped regions of the two recordings are offset with respect to one another, acceptable spatial resolution is obtained for the entire region to be imaged when the two tomograms are combined. However, since two successive tomograms are necessary in this procedure, the measurement time for a region to be imaged is thus doubled.

The invention is therefore based on the object of providing an NMR imaging method in which a high-resolution image of the region to be imaged is obtained more quickly utilizing the advantages of NBSEMs.

SUMMARY OF THE INVENTION

This object is achieved by an NMR imaging method as described above, which is characterized in that the second form $B_{grad}^2$ is essentially identical to the first form $B_{grad}^1$, with the second form $B_{grad}^2$ being rotated through an angle $\Delta\phi$, where $$\Delta\varphi = \frac{360°}{2 \cdot ns},$$

relative to the first form $B_{grad}^1$.

The invention is based on the utilization of two forms $B_{grad}^1$ and $B_{grad}^2$ of an encoding magnetic field which are specifically oriented to one another within one measurement cycle, in which the respective associated field gradients dB/dz are perpendicular to one another with good accuracy throughout the region to be imaged. In other words, the respective lines of equal field strength (contour lines) of the two forms are perpendicular to one another. Good and isotropic spatial resolution of the tomogram only arises in the regions in which the field gradients of the two forms are orthogonal to one another. Such orthogonality arises, to a good approximation, in two multipole fields which are identical, but rotated through half a pole separation angle (pole separation angle=360°/ns, where ns=number of poles) with respect to one another, as observed in the course of the invention.

It should be noted that the two forms of the encoding magnetic field according to the invention are aligned essentially concentrically. The forms with essentially ns poles have approximately a multiplicity symmetry of ns/2, i.e. the form is approximately converted into itself by rotation through a whole multiple of 360°/(ns/2).

In the prior art according to DE 10 2005 051 021 A1, orthogonality of the two field gradients of the two forms of the encoding magnetic field (radial field gradient and multipole field arrangement) is only present in the angle regions between the poles of the multipole field arrangement; in the angle regions at the poles (i.e. in the regions of the field-strength maxima and field-strength minima of the multipole field arrangement), the lines of equal field strength of the two forms are aligned approximately parallel (namely approximately in the circumferential direction). Correspondingly, stripe-shaped regions of poor spatial resolution arise in the angle regions on the poles and have to be recorded via a second tomogram (i.e. a second measurement cycle).

The present invention facilitates imaging of essentially the entire region to be imaged within one measurement cycle. In particular, no regions in which the contour lines of the two forms of the encoding magnetic field according to the invention would be aligned parallel (and thus the sample would have poor local spatial resolution) arise in the region to be imaged. Compared with the prior art, the present invention thus enables a second tomogram to be omitted (or a second measurement cycle to be omitted) with respect to the same measurement-sample region to be imaged (for example the same layer in the object being investigated). The method according to the invention thus enables high-resolution tomography images to be obtained particularly quickly.

Preferred Variants of the Invention

Particular preference is given to a variant of the method according to the invention in which, in the measurement cycle, the first form $B_{grad}^1$ is employed as phase gradient during excitation and the second form $B_{grad}^2$ is employed as reading gradient during reading. In this way, two-dimensional spatial encoding can be carried out very simply by means of the two forms according to the invention.

The present invention also encompasses the use of an NMR tomography apparatus comprising
  a gradient system suitable for the generation of a temporally and spatially variable magnetic field $B_{grad}$,
  at least ns measurement coils,
in a method according to the invention indicated above. The gradient system here is suitable for generation of the two forms of the encoding magnetic field. The two NBSEM forms permit high gradient steepnesses and thus high spatial resolutions. By means of the at least ns measurement coils, the ambiguity in the spatial assignment of the NBSEM forms is eliminated. One measurement cycle is sufficient to image a region to be imaged completely with spatial resolution. Overall, high spatial resolutions are thus possible over large, closed regions (i.e. the entire region to be imaged in the respective measurement cycle) with a short measurement time in this use.

Particular preference is given to a use variant which is characterized in that the NMR tomography apparatus comprises a gradient system having 2*ns gradient coils which are arranged in a ring-shaped, in particular circular ring-shaped, and uniform cylindrical distribution,
in that the gradient coils for generation of the first form $B_{grad}^1$ are operated with a first polarity scheme (++--++--), in which in each case two adjacent coils have the same polarity,
and in that the gradient coils for generation of the second form $B_{grad}^2$ are operated with a second polarity scheme (+--++--+), which is shifted by one coil position relative to the first polarity scheme. The gradient system comprises the 2*ns gradient coils, typically in a planar, ring-shaped arrangement, where the gradient coils are aligned with a common centre. In principle, the gradient system can be constructed in a uniform manner or also from two sub-gradient systems. The simplest structure of the NMR tomography apparatus here is a planar 2*ns-cornered arrangement of the gradient coils which covers the sample region to be imaged, where the gradient coils are operated as indicated above.

A preferred use variant proposes that the gradient system comprises two sub-gradient systems, each of which comprises ns gradient coils, where the ns gradient coils are in each case arranged on a ring, in particular a circular ring, in a uniform cylindrical distribution, where the sub-gradient systems are arranged nested in one another, and the gradient coils of the sub-gradient systems alternate. The two polarity schemes for the two forms of the encoding magnetic field can then easily be set by activation of the two sub-gradient systems as a whole. The size (in particular the diameter of the typically circular ring-shaped, planar rings) of the two sub-gradient systems is preferably identical; for space reasons, however, it may be necessary to construct one of the sub-gradient systems somewhat smaller (for example with respect to the ring diameter) than the other.

In a refinement of this use variant, the rings of the sub-gradient systems are additionally tilted with respect to one another with respect to the direction of a static main magnetic field $B_0$. The tilted ring planes enable adaptation to the geometry of the sample, i.e. the object being investigated (for example to the sphere-like shape of a human head).

Another advantageous refinement proposes that the gradient coils of the two sub-gradient systems are in each case connected together to form a current circuit, in which the current flows in alternating direction, and in that each of the two current circuits is provided with its own voltage source. This simplifies activation of the gradient coils.

Another preferred use variant is characterized in that each gradient coil is provided with its own voltage source, or in that subsets of gradient coils are each provided with their own voltage source. In this case, the field profiles can be modified by changing or adapting the current strengths in the individual gradient coils in such a way that they are matched to the object being investigated.

Preference is also given here to a use variant in which the gradient coils arranged in a ring shape have an oval arrangement. This enables the encoding magnetic fields to be matched to the shape of the object being investigated, in particular the shape of a human head.

In another preferred use variant, the reading coils provided are ns cylindrical coils, each of which surrounds individual objects. This arrangement is particularly suitable for the series investigation of mice and rats. The sample here has multiple parts.

Alternatively, another use variant proposes that ns reading coils are provided in an inside-out arrangement. The ns reading coils here are arranged centrally with respect to the space to be investigated. This also enables series investigations of mice and rats to be carried out well.

Further advantages of the invention arise from the description and the drawing. The features mentioned above and the features furthermore carried out can each likewise be used in accordance with the invention individually or together in any desired combinations. The embodiments shown and described should not be regarded as a definitive list, but instead have an illustrative character for outlining the invention.

BRIEF DESCRIPTION OF THE DRAWINGS

The invention is depicted in the drawing and is explained in greater detail with reference to illustrative embodiments.

FIG. 2a shows a contour diagram of an 8-pole magnetic field;

FIG. 2b shows a contour diagram of an 8-pole magnetic field, rotated through half a pole separation angle (=22.5°) relative to the contour diagram of FIG. 2a;

FIG. 6a shows a diagrammatic representation of an NMR tomography apparatus for use according to the invention having eight measurement coils, into each of which an object has been inserted;

FIG. 6b shows a diagrammatic representation of an NMR tomography apparatus for use according to the invention having eight measurement coils in inside-out arrangement, where an object is arranged in front of each measurement coil.

DETAILED DESCRIPTION

The present invention relates to a refinement of NMR tomography methods or arrangements which have become known under the term "PatLoc" from DE 10 2005 051 021 A1, and in particular to the use of multipole encoding fields in pseudo-Bessel arrangement.

The present invention utilizes ambivalent/non-bijective spatially encoding magnetic fields (=NBSEMs) for the measurement of samples (objects being investigated, measurement objects) in a region to be imaged. Unambiguously encoding magnetic fields are in each case only present in sub-regions of the region to be imaged; the sub-regions are typically delimited from one another by local extremes of the magnetic field or hyper areas which are defined by these local extremes. In order to enable the assignment of measurement signals to locations in various sub-regions, measurement coils which are sensitive in a spatially selective manner are employed, and parallel reconstruction methods then enable a complete tomogram to be obtained from the signals from the measurement coils. In the simplest case, each sub-region of the space to be investigated is provided with its own measurement coil (receiver coil) which is only sensitive over this sub-region.

DE 10 2005 051 021 A1 has shown that two-dimensional spatial encoding can be carried out in a single measurement cycle if the radial field shown in FIG. 11a therein (called $SEM_R$ here) is combined with a multipole field shown in FIG. 11b therein (called $SEM_C$ here). The shapes of encoding "gradient fields" used within a measurement cycle (from excitation to recording of the measurement signals, typically corresponding to the measurement of an individual layer of a measurement object) are also referred to here as forms of the (two-dimensional) encoding magnetic field. DE 10 2005 051 021 A1 describes that the above-mentioned combination of NBSEMs, i.e. the use of the two forms $SEM_R$ and $SEM_C$, only enables restricted imaging, namely with restrictions at the locations (more precisely stripe-shaped regions) of the local field inversion of the $SEM_C$. The document proposes repeating the recording with the $SEM_C$ rotated through half a pole separation (through 22.5° in the case of an 8-pole arrangement) for continuous imaging (uniform spatial encoding). A multipole field rotated through half a pole separation angle is referred to below as $SEM_{IC}$. The disadvantage of this procedure is the doubled measurement time due to repetition of the measurement.

Method According to the Invention

Figure 3:
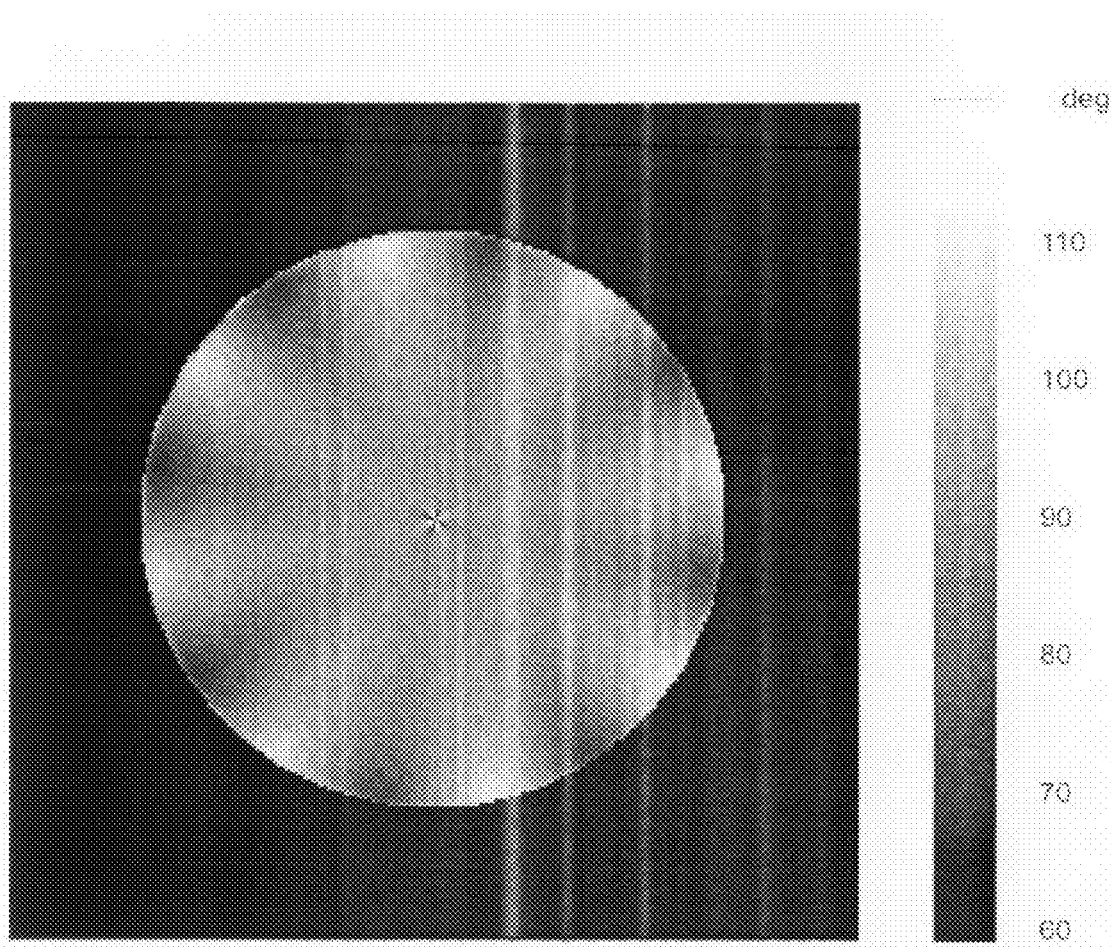
FIG. 3 shows the spatial distribution of the angles of the local magnetic-field gradients of the magnetic fields of FIG. 2a and FIG. 2b.

The method according to the invention is based on the observation that the magnetic-field gradients dB/dz generated by the two mutually rotated multipole NBSEMs (i.e. $SEM_C$ and $SEM_{IC}$) are (virtually) orthogonal to one another over the entire measurement range (cf. FIG. 3). An image generated using these two NBSEMs ($SEM_C$ and $SEM_{IC}$) as forms ($B_{grad}^1$ and $B_{grad}^2$) of the encoding magnetic field ($B_{grad}$) in a single measurement cycle thus exhibits more homogeneous imaging in the circumferential direction compared with the known method (cf. FIG. 4).

One NBSEM (or the associated gradient) alone makes spatial encoding along a first direction, which is given by the local direction of the field gradient of the NBSEM. For two-dimensional spatial encoding, the information along the direction orthogonal thereto is needed. On use of a second NBSEM, it is always only the orthogonal (with respect to the gradient of the first NBSEM) component of the gradient of the second NBSEM that contributes to the spatial resolution. The two forms of the encoding magnetic field according to the invention have (substantially) orthogonal gradients from the outset, producing particularly good spatial resolution.

Figure 1:
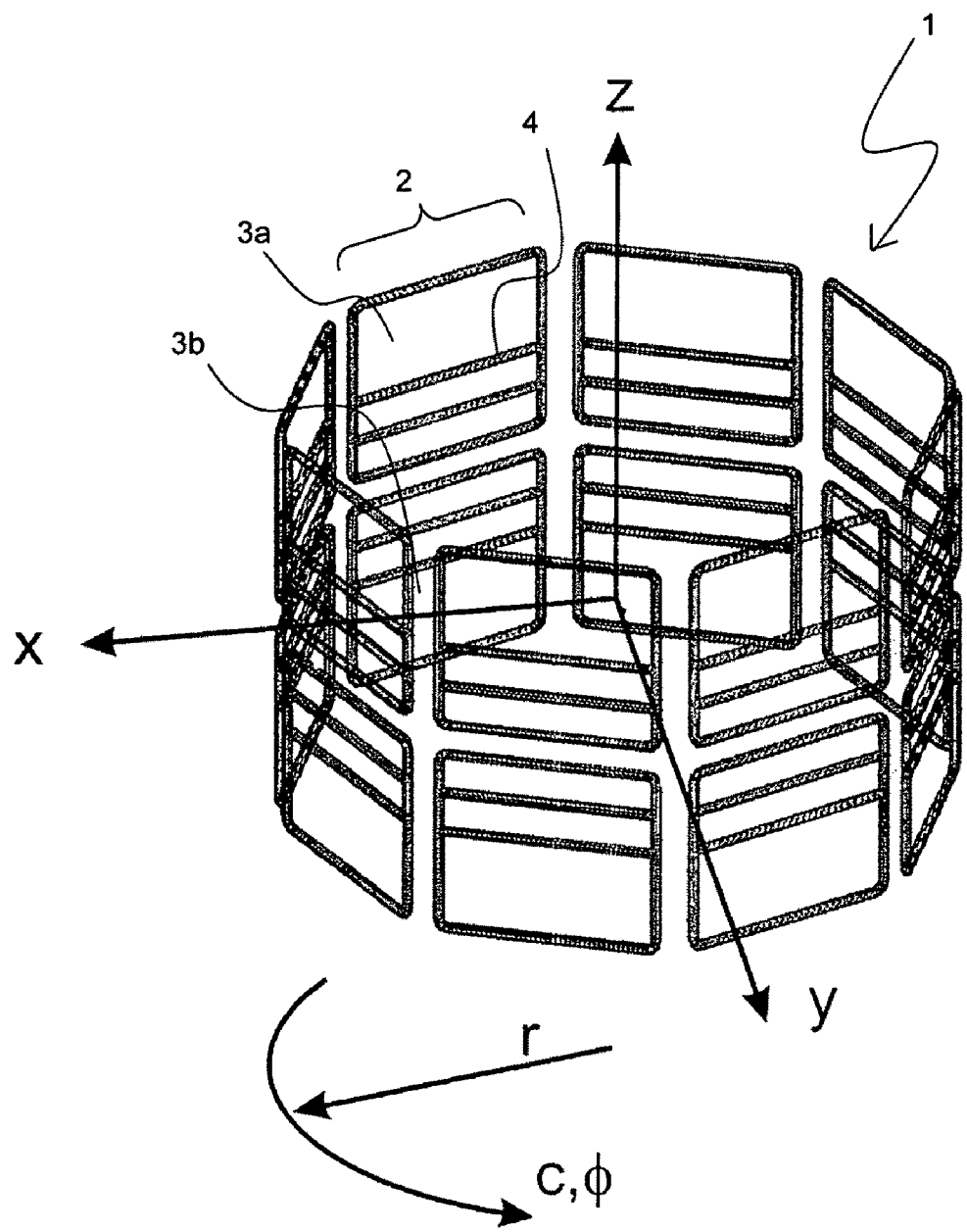
FIG. 1 shows an octagonal gradient system for the generation of an 8-pole magnetic field or two forms of a 4-pole magnetic field for the method according to the invention.

FIG. 1 shows a gradient system 1 comprising eight gradient coils (individual coils) 2, which is suitable for the generation of an 8-pole magnetic field or also for the generation of two 4-pole magnetic fields rotated through half a pole separation angle with respect to one another, both for use in a method according to the invention. Each individual coil 2 here comprises an upper and a lower coil window 3a, 3b. The basic unit selected in FIG. 1 for an individual coil 2 of this type which allows fields of the desired geometry over an extended region in the direction of the static magnetic field (main magnetic field) $B_0$ was a configuration corresponding to a known flat gradient design by Cho and Yi, cf. Cho, Z H., Yi, J H. (1991) A Novel Type of Surface Gradient Coil, J. Magn. Reson. 94: 471-495. The gradient system 1 is an octagonal arrangement of eight flat "head-to-head" individual coils 2, which are arranged cylindrically around the axis of the main magnetic field ($B_0$ in the z-direction). x,y denote the Cartesian coordinates perpendicular to the main magnetic field, r and φ are the corresponding polar coordinates, c denotes the circumferential vector in the direction of increasing φ. The current flow in each "head-to-head" individual coil 2 is such that flow through the conductors in the six internal rungs 4 takes place in the same direction. The sample (not shown) or the region to be imaged is located inside the gradient system 1.

FIG. 2a shows a contour diagram of the magnetic field in the cylindrical cavity of an arrangement called $SEM_C$ (in the case of generation of an 8-pole magnetic field with pole scheme +−+−+−+−) corresponding to FIG. 1. The flow direction in adjacent "head-to-head" individual coils is in each case reversed with the polarity of the fields (marked by "+" and "−") alternating correspondingly. It can be seen that a local bijective magnetic field is present in each sectorial sub-region (in the angle region from an "+" to the adjacent "−"). FIG. 2b shows a contour diagram of the magnetic field in the cylindrical cavity in an arrangement called $SEM_{IC}$, which arises from $SEM_C$ by rotation through 360°/(2*8)=22.5°.

FIG. 3 shows the local angle between the gradients of the eight-pole $SEM_C$ and the eight-pole $SEM_{IC}$ from FIGS. 2a, 2b. The intermediate angle (or the angle between the contour lines) is at least 70.2°, at most 109.5°, but is usually about 90°.

Figures 4A, 4B, 4C:
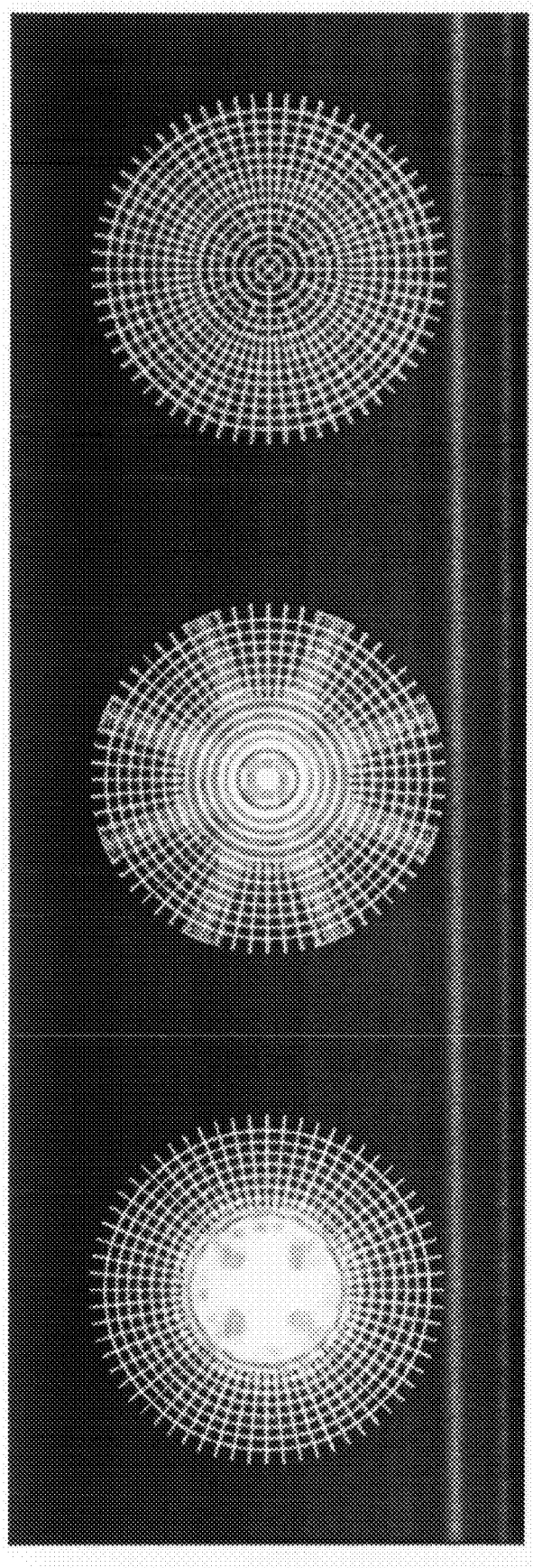
FIG. 4a shows a digitally generated test object for demonstration of the imaging properties of the method according to the invention.
FIG. 4b shows an image of the test object of FIG. 4a on use of an encoding magnetic field with the two forms of radial field gradient and 8-pole magnetic field in accordance with the prior art.
FIG. 4c shows an image of the test object of FIG. 4a on use of an encoding magnetic field with the two forms of 8-pole magnetic field and the same 8-pole magnetic field in accordance with the invention rotated through 22.5°.

FIG. 4a shows a digitally generated test object for simulation of the imaging properties of the method according to the invention. FIG. 4b shows the image of this test object by imaging with the fields known from the literature (i.e. forms of the encoding magnetic field) $SEM_R$ and (eight-pole) $SEM_C$. Eight stripe-shaped regions of poor spatial resolution are evident. FIG. 4c shows the image of the test object by imaging with the eight-pole fields $SEM_{IC}$ and $SEM_C$ according to the invention; the image is very homogeneous in the circumferential direction and free from regions of poor resolution.

In the method according to the invention, the image becomes increasingly less sharp towards the centre owing to the gradient field decreasing towards the inside; for the 8-pole arrangement, the usable radius comprises approximately the (outer) half of the limiting circle of the gradient system, cf. FIG. 4c. However, a comparable lack of sharpness also arises in the prior art, cf. FIG. 4b.

The principle according to the invention works not only for an 8-pole arrangement of coils, but also for any (even) number ns of coils in ns-cornered arrangement. An NMR tomography apparatus for use of the method according to the invention therefore comprises an ns-cornered arrangement of coils of alternating polarity generating encoding fields and an arrangement which is (essentially) identical, but rotated through 180/ns° with respect thereto, or also a 2*ns-cornered arrangement of field-generating coils.

As criterion for the choice of ns, it should be noted that, for a small ns, the angle (cf. FIG. 3) between the respectively complementary arrangements (or gradients/contour lines thereof) differs from orthogonality over the volume covered to a greater extent than for a large ns. On the other hand, the radially usable region is more extensive towards the centre for small ns, while the measurement field is increasingly displaced at the edge of the cylindrical covered volume with increasing ns.

Figure 5:
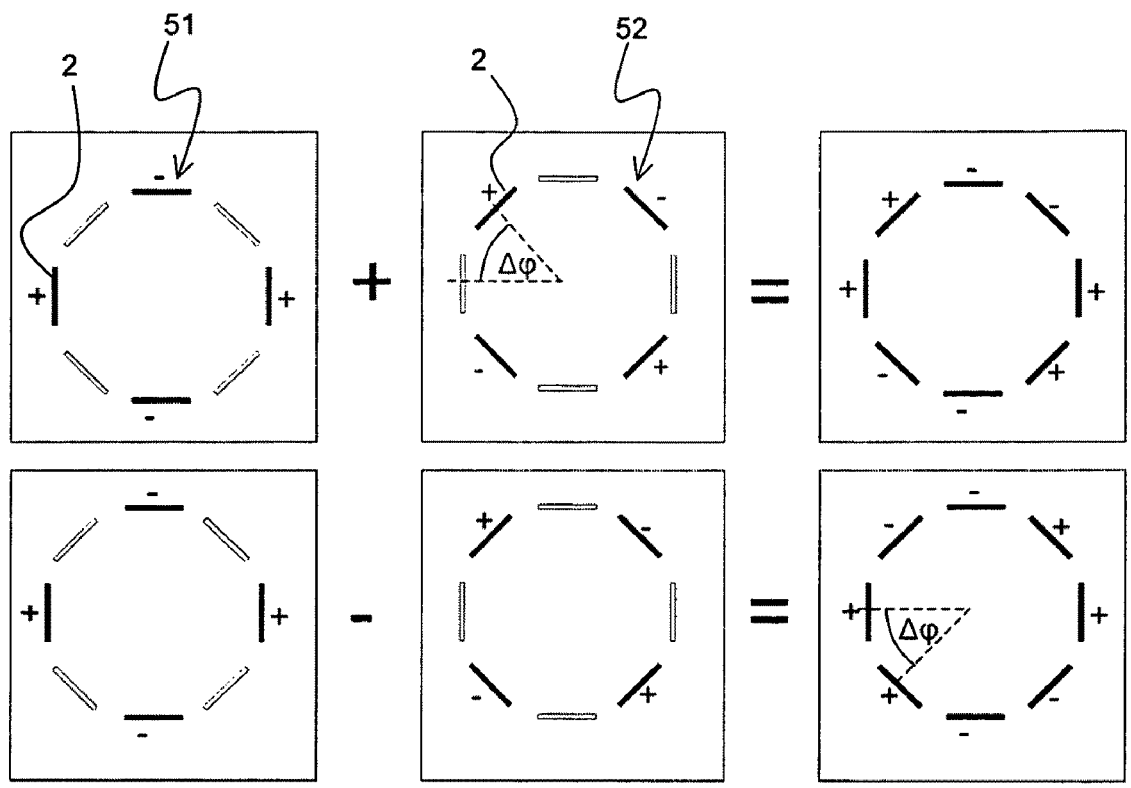
FIG. 5 shows a diagrammatic illustration for the generation in accordance with the invention of two 4-pole magnetic-field forms with rotation angles of 45°, by means of two sub-gradient systems.

As a preferred way of achieving an arrangement of this type, the ns-pole fields are generated by 2*ns individual coils, where in each case ns individual coils are connected together in alternating arrangement to form a current circuit, in which the current in turn flows in alternating direction (FIG. 5). By changing the flow direction in one of the two arrangements, both ns-pole field profiles (forms) can thus be generated with one and the same coil arrangement with the aid of two current circuits connected to two current/voltage sources.

FIG. 5 illustrates the principle of assembly of in each case four individual coils to form a current circuit with the flow direction indicated by the sign. Through addition (top in FIG. 5) or subtraction (bottom in FIG. 5), 4-pole $SEM_C$ (top) and associated $SEM_{IC}$ (bottom) can in each case be generated using this arrangement.

In each case, four individual coils 2 are connected together here to form a sub-gradient system 51, 52, with the polarity in the respective sub-gradient system 51, 52 alternating (i.e. changing from coil to adjacent coil) through corresponding connection, as marked by "+" and "−". The first sub-gradient system 51 is in each case highlighted in black on the left in FIG. 5, and the second sub-gradient system 52 is in each case highlighted in black in the centre of FIG. 5. The sub-gradient systems 51, 52 of the same type are placed concentrically one inside the other, and rotated through half a pole separation angle Δφ=45° with respect to one another. Addition of the fields of the two sub-gradient systems 51, 52 produces the four-pole $SEM_C$ in the pole scheme "++−−++−−", cf. top right in FIG. 5 (numbering of the pole scheme beginning on the left in the centre); subtraction (i.e. current reversal in the second sub-gradient system 52) produces the $SEM_{IC}$, which is rotated through half a pole separation angle Δφ=45° in the pole scheme "+−−++−−+", cf. bottom right in FIG. 5.

A further preferred arrangement for measurement of the human head consists in the individual coils not being arranged in a circular shape, but instead in an oval arrangement in order to match the fields geometrically to a head shape. The coil arrangements (sub-gradient systems) here may additionally be tilted with respect to one another with respect to the direction of the main magnetic field in order to adapt the cylindrical geometry of a strictly polygonal arrangement more in the direction of a three-dimensionally round, spherical geometry.

In a further preferred arrangement, the current through each of the individual gradient coils (or subsets thereof) is generated by a separate current circuit. In the limiting case, this then requires ns independent current circuits and ns current/voltage sources. An arrangement of this type can be used to modify the field profiles so that they are matched to the object being investigated by changing the current strength in the individual coils. Thus, increasing the current in opposite individual coils enables the generation of an oval field profile (for example for measurement of the human head).

The nuclear resonance signal is observed with the aid of nc receiver coils (measurement coils), where nc is selected ≧ns, in order to convert the ns-fold ambivalence of the ns-pole fields into clear spatial encoding through the use of parallel image reconstruction algorithms. For measurements on closed, concave bodies (such as the human head), the receiver coils are preferably arranged in the periphery of the field generated by the BNSEMs. However, there are also applications in which a plurality of objects are to be investigated simultaneously (i.e. in one measurement cycle), for example in series investigations of mice and rats, cf. in this respect Nieman B J, Bishop J, Dazai J, Bock N A, Lerch J P, Feintuch A, Chen X J, Sled J G, Henkelman R M. MR technology for biological studies in mice. NMR Biomed. 2007 May; 20(3): 291-303. An implementation of the method according to the invention which is preferred for such tasks is based on the use of ns independent individual measurement coils, which either surround the individual objects as cylindrical coils (FIG. 6 top) or alternatively are arranged centrally in an inside-out arrangement (FIG. 6 bottom).

FIGS. 6a, 6b illustrate the principle of measurement of eight individual objects 62 (for example small animals, such as mice or rats) in an octagonal arrangement of individual coils 2 for encoding field generation corresponding to the method according to the invention. The individual objects 62 are each measured separately (but in the same measurement cycle) by measurement coils (RF coils, coil arrangements) 61a, 61b, which surround each individual object (61a in FIG. 6a), or by RF coils in "inside-out" arrangement (61b in FIG. 6b).

What is claimed is:

1. Nuclear magnetic resonance (NMR) imaging method in which, with the aid of a gradient system (1), a spatially and temporally variable magnetic field $B_{grad}$ is i generated, for the at least two-dimensional spatial encoding of NMR measurement signals in a measurement sample region to be imaged, where the magnetic field $B_{grad}$ is employed in at least two forms $B_{grad}^{1}$ (SEW) and $B_{grad}^{2}$ (SEM$_{IC}$) in the measurement sample region to be imaged during a single measurement cycle from excitation to reading of the NMR measurement signals, where the first form $B_{grad}^{1}$ (SEW$_C$) has essentially ns poles, where ns is an even number $\geq 2$, and has ns essentially sectorial sub-regions, in each of which the magnetic field $B_{grad}$ is locally monotonic in one direction, where the measurement signals from the measurement sample are recorded by means of at least ns receiver coils (61a, 61b) which have different sensitivity over the ns sub-regions of the region to be imaged, characterized in that the second form $B_{grad}^{2}$ (SEM$_{IC}$) is essentially identical to the first form $B_{grad}^{1}$(SEW$_C$), with the second form $B_{grad}^{2}$ (SEW$_{IC}$) being rotated by an angle $\Delta\phi$, where $$\Delta\varphi = \frac{360°}{2 \cdot ns},$$

relative to the first form $B_{grad}^{1}$ (SEW$_c$).

2. Method according to claim 1, characterized in that, in the measurement cycle, the first form $B_{grad}^{1}$ (SEW$_c$) is employed as phase gradient during excitation and the second form $B_{grad}^{2}$ (SEM$_{IC}$) is employed as reading gradient during reading.

3. Method according to claim 1, characterized in that the method is performed on an NMR tomography apparatus comprising a gradient system (1) suitable for the generation of a temporally and spatially variable magnetic field $B_{grad}$, at least ns measurement coils (61a, 61b), in a method according to claim 1.

4. Method according to claim 3, characterized in that the NMR tomography apparatus comprises a gradient system (1) having 2*ns gradient coils (2) which are arranged in a ring-shaped, in particular circular ring-shaped, and uniform cylindrical distribution, in that the gradient coils (2) for generation of the first form $B_{grad}^{2}$ (SEM$_{IC}$)are operated with a first polarity scheme (++−−++−−), in which in each case two adjacent coils (2) have the same polarity, and in that the gradient coils (2) for generation of the second form $B_{grad}^{2}$ (SEM$_{IC}$) are operated with a second polarity scheme (+−−++−−+), which is shifted by one coil position relative to the first polarity scheme.

5. Method according to claim 3, characterized in that the gradient system (1) comprises two sub-gradient systems (51, 52), each of which comprises ns gradient coils (2), where the ns gradient coils (2) are in each case arranged on a ring, in particular a circular ring, in a uniform cylindrical distribution, where the sub-gradient systems (51, 52) are arranged nested in one another, and the gradient coils (2) of the sub-gradient systems (51, 52) alternate.

6. Method according to claim 5, characterized in that the rings of the sub-gradient systems (51, 52) are additionally tilted with respect to one another with respect to the direction (z) of a static main magnetic field $B_0$.

7. Method according to one of claim 5, characterized in that the gradient coils (2) of the two sub-gradient systems (51, 52) are in each case connected together to form a current circuit, in which the current flows in alternating direction, and in that each of the two current circuits is provided with its own voltage source.

8. Method according to claim 4, characterized in that each gradient coil (2) is provided with its own voltage source, or in that subsets of gradient coils (2) are each provided with their own voltage source.

9. Method according to claim 3, characterized in that the gradient coils (2) arranged in a ring shape have an oval arrangement.

10. Method according to claim 3, characterized in that the reading coils (61a) provided are ns cylindrical coils, each of which surrounds an individual object (62).

11. Method according to claim 3, characterized in that ns reading coils (61b) are provided in an inside-out arrangement.

12. An NMR tomography apparatus comprising:

a gradient system (1) suitable for generation of a temporally and spatially variable magnetic field $B_{grad}$;

at least ns measurement coils (61a, 61b) adapted for performing the method according to claim 1.

* * * * *